United States Patent
Ikeda et al.

(10) Patent No.: US 6,822,159 B2
(45) Date of Patent: Nov. 23, 2004

(54) DYE-SENSITIZED PHOTOELECTRIC CONVERSION DEVICE

(75) Inventors: Masaaki Ikeda, Tokyo (JP); Koichiro Shigaki, Tokyo (JP); Teruhisa Inoue, Tokyo (JP); Shozo Yanagida, 2-10-13, Uguisudai, Kawanishi-shi, Hyogo 666-0133 (JP)

(73) Assignees: Nippon Kayaku Kabushiki Kaisha, Tokyo (JP); Shozo Yanagida, Hyogo (JP)

( * ) Notice: Subject to any disclaimer, the term of this patent is extended or adjusted under 35 U.S.C. 154(b) by 2 days.

(21) Appl. No.: 10/311,036

(22) PCT Filed: Jun. 26, 2001

(86) PCT No.: PCT/JP01/05452
§ 371 (c)(1),
(2), (4) Date: Dec. 12, 2002

(87) PCT Pub. No.: WO02/01667
PCT Pub. Date: Jan. 3, 2002

(65) Prior Publication Data
US 2003/0183271 A1 Oct. 2, 2003

(30) Foreign Application Priority Data
Jun. 29, 2000 (JP) .......................... 2000-195464

(51) Int. Cl.[7] .......................... H01M 14/00; H01L 31/04
(52) U.S. Cl. .................. 136/263; 136/252; 136/256; 257/40; 257/43; 257/431
(58) Field of Search .................. 136/252, 263, 136/256; 257/40, 43, 431

(56) References Cited

U.S. PATENT DOCUMENTS

| | | | |
|---|---|---|---|
| 4,992,109 A | * 2/1991 | Yoshikawa et al. | 136/263 |
| 6,150,605 A | 11/2000 | Han | 136/263 |
| 6,153,824 A | 11/2000 | Yoshiyuki et al. | |
| 6,469,243 B2 | * 10/2002 | Yamanaka et al. | 136/263 |
| 6,653,701 B1 | * 11/2003 | Yamazaki et al. | 257/414 |
| 6,664,462 B2 | * 12/2003 | Arakawa et al. | 136/263 |
| 2002/0108649 A1 | * 8/2002 | Fujimori et al. | 136/263 |
| 2003/0152827 A1 | * 8/2003 | Ikeda et al. | 429/111 |

FOREIGN PATENT DOCUMENTS

| | | |
|---|---|---|
| EP | 0 887 817 | 12/1998 |
| JP | 5-173333 | 7/1993 |
| JP | 5-206489 | 8/1993 |
| JP | 10-92477 A * | 4/1998 |
| JP | 10-92477 | 4/1998 |
| JP | 10-93118 | 4/1998 |
| JP | 11-167937 | 6/1999 |
| JP | 11-273754 | 10/1999 |
| JP | 11-273755 | 10/1999 |

OTHER PUBLICATIONS

Copy of the International Search Report dated Sep. 11, 2001.
Yuuki Gousei Kagaku ed., "Senryou Binran", Jun. 30, 1959, Maruzen, pp. 319 to 790.

* cited by examiner

Primary Examiner—Alan Diamond
(74) Attorney, Agent, or Firm—Nields & Lemack

(57) ABSTRACT

The present invention aims at developing a low-cost photoelectric conversion device having favorable conversion efficiency and a solar cell and, accordingly, relates to a photoelectric conversion device of a semiconductor fine particles, being sensitized with an organic dye, which adsorbs thereon a specified azo dye expressed by the general formula 1:

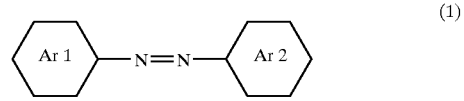

(1)

wherein Ar 1 represents an aromatic group having at least one substituent selected from the group consisting of a carboxylic acid group, a hydroxyl group, a phosphoric acid group, a phosphoric acid ester group and a mercapto group either directly or via a cross-linking group; and Ar 2 represents an aromatic group having at least one electron-donating group as a substituent, and also to a solar cell using the photoelectric conversion device.

20 Claims, No Drawings

DYE-SENSITIZED PHOTOELECTRIC CONVERSION DEVICE

TECHNICAL FIELD

The present invention relates to semiconductor fine particles sensitized with dye(s), photoelectric conversion devices sensitized with dye(s) and solar cell sensitized with a dye, and in particular to a semiconductor fine particle sensitized with azo dye(s), a photoelectric conversion device sensitized with azo dye(s) and a solar cell utilizing the same.

BACKGROUND OF THE INVENTION

A solar cell utilizing sunlight as an alternative energy source to a fossil fuel such as petroleum, coal or the like has been in the spotlight. Today, developments and studies are being conducted on enhancement of efficiency and the like of a silicon solar cell which uses crystalline or amorphous silicon, a compound semiconductor solar cell which uses gallium, arsenic or the like. However, since much energy is required for producing these solar cells and the cost of them is high, there is a problem that it is difficult to put them to general use. Further, a photoelectric conversion device which uses semiconductor fine particles sensitized with dye(s) and a solar cell which uses this device have been known whereupon materials for use in producing them and techniques for producing them have been disclosed. (B. O'Regan and M. Gratzel Nature, 353, 737 (1991), M. K. Nazeeruddin, A. Kay, I. Rodicio, R. Humphry-Baker, E. Muller, P. Liska, N. Vlachopoulos, M. Gratzel, J. Am. Chem. Soc., 115, 6382 (1993) e.t.c.). This photoelectric conversion device is produced by using a comparatively low-cost oxide semiconductor such as titanium oxide or the like. Since there is a possibility that a photoelectric conversion device can be obtained in low cost compared with a solar cell which uses a conventional silicon or the like, this device has been remarked. However, in order to obtain a device having high conversion efficiency, a ruthenium-type complex is used as a sensitizing dye wherein the dye itself is high in cost and there also is a problem in supply thereof. Further, although it has already been attempted to use an organic dye as a sensitizing dye, it is a present situation that, due to low conversion efficiency and the like, it has not yet been used practically.

A development of a photoelectric conversion device, using an organic dye-sensitized semiconductor, which has high conversion efficiency as well as high practicability has been required.

DISCLOSURE OF THE INVENTION

The present inventors have made an extensive effort to solve the above-described problems and, as a result, have found that a photoelectric conversion device having high conversion efficiency can be obtained by sensitizing semiconductor particles with a specified azo-type dye and, then, producing a photoelectric conversion device to achieve the present invention.

Namely, the present invention relates to (1) a photoelectric conversion device, comprising an oxide semiconductor fine particles sensitized with at least one azo dye represented by the following formula (1):

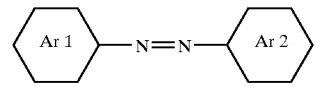

wherein Ar 1 represents an aromatic group having at least one substituent selected from the group consisting of a carboxylic acid group, a hydroxyl group, a phosphoric acid group, a phosphoric acid ester group and a mercapto group either directly or via a cross-linking group; and Ar 2 represents an aromatic group having at least one electron-donating group as a substituent, and wherein Ar 1 and Ar 2 may have other substituents than those defined above, (2) the photoelectric conversion device of the above-described (1), wherein Ar 1 of the azo dye mentioned in the above-described (1) has at least 2 substituents selected from the group consisting of a carboxylic acid group, a hydroxyl group, a phosphoric acid group, aphosphoric acid ester group and a mercapto group, (3) the photoelectric conversion device of the above-described (2), characterized in that at least 2 of substituents on Ar 1 of the azo dye mentioned in the above-described (1) are groups selected from the group consisting of a carboxylic acid group and a hydroxyl group, (4) the photoelectric conversion device mentioned in the above-described (2) or (3), wherein at least 2 of substituents on Ar 1 of the azo dye mentioned in the above-described (1) are substituted at any two adjacent positions within a same aromatic ring, (5) the photoelectric conversion device mentioned in any one of the above-described (1) to (4) wherein the electron-donating groups in Ar 2 of the azo dye mentioned in the above-described (1) are one, or two or more substituents, which may further be substituted, selected from the group consisting of an amino group, a hydroxyl group and an alkoxyl group, (6) the photoelectric conversion device mentioned in any one of the above-described (1) to (5), comprising oxide semiconductor fine particles sensitized with the azo dye mentioned in at least one of the above-described (1) to (5) and another metal complex and/or another organic dye, (7) the photoelectric conversion device mentioned in any one of the above-described (1) to (6), wherein the oxide semiconductor fine particles contain titanium dioxide as an essential component, (8) the photoelectric conversion device mentioned in any one of the above-described (1) to (6), wherein a dye is absorbed on the oxide semiconductor fine particles in the presence of an inclusion compound, (9) a solar cell, characterized by comprising using the photoelectric conversion device mentioned in any one of the above-described (1) to (8), and

(10) a photoelectric conversion device, comprising a semiconductor thin film which adsorbs thereon at least one azo dye represented by the following formula (1):

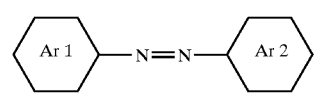

wherein Ar 1 represents an aromatic group having at least one substituent selected from the group consisting of a carboxylic acid group, a hydroxyl group, a phosphoric acid group, a phosphoric acid ester group and a mercapto group either directly or via a cross-linking group; and Ar 2 represents an aromatic group having at least one electron-donating group as a substituent, said semiconductor thin film being formed from oxide semiconductor fine particles.

BEST MODE FOR CARRYING OUT THE INVENTION

The present invention will be described in detail below. A photoelectric conversion device according to the present invention uses an oxide semiconductor sensitized with an azo dye. The azo dye to be used in the present invention is characterized by being represented by the following general formula (1):

General formula (1):

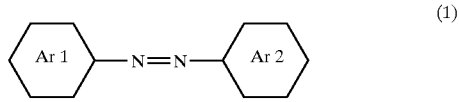

(1)

wherein Ar 1 represents an aromatic group having at least one substituent selected from the group consisting of a carboxyl group, a hydroxyl group, a phosphoric acid group, a phosphoric ester group and a mercapto group either directly or via a cross-linking group; and Ar 2 represents an aromatic group having at least one electron-donating group as a substituent.

In the general formula (1), Ar 1 shows an aromatic group which has at least one substituent selected from the group consisting of a carboxyl group, a hydroxyl group, a phosphoric acid group, a phosphoric ester group and a mercapto group either directly or via a cross-linking group and, further, may have another substituent, and Ar 2 shows an aromatic group which has at least one electron-donating group as a substituent. Further, Ar 1 and Ar 2 may further have other substituents than those defined above.

Further, the term "aromatic group" used herein means a group which is a substituted or non-substituted aromatic ring deprived of one hydrogen atom therefrom; on this occasion, as such aromatic rings, mentioned are monocyclic or condensed polycyclic aromatic rings such as a benzene ring, a naphthalene ring, an anthracene ring, a phenanthrene ring, a pyrene ring, an indene ring, an azulene ring, a fluorene ring and the like. As a preferable aromatic group, mentioned is a phenyl group or a naphthyl group.

An essential substituent in Ar 1 is selected from the group consisting of a carboxyl group, a hydroxyl group, a phosphoric acid group, a phosphoric ester group and a mercapto group. As a preferable group, mentioned are the carboxyl group and the hydroxyl group. Further, a cross-linking group, for example, a methine group, a methylene group or the like, may be present between these substituents and an aromatic group. Although it is essential that the number of these substituents is one or more, it is preferable that the number is two or more. When the plural above-described substituents are contained, any of cases in which two or more of substituents of one type are contained, two or more of substituents contained are of different types from each other, two or more of substituents of same type and a substituent of different type from the foregoing type are simultaneously contained and the like may be possible. As a preferable combination, mentioned are a combination such as a carboxyl group and a hydroxyl group. Further, a combination of a phosphoric acid group and a hydroxyl group may be possible. Further, when plural substituents of same type are contained, cases in which from 2 to 4 carboxylic acid groups are contained, from 2 to 4 hydroxyl groups are contained and the like are mentioned. As a most preferable case, there is a case in which one or more carboxylic acid groups and one or more hydroxyl groups are contained. Further, these substituents may form a salt with an alkali metal or a quaternary ammonium or may form an intramolecular salt.

Ar 2 has at least one electron-donating group as a substituent. Specific examples of the electron-donating groups include an amino group which may be substituted, a hydroxyl group, an alkoxyl group which may be substituted and the like. Substituents in the amino group include an aliphatic group such as an alkyl group or the like, an aromatic group which may be substituted or non-substitued such as a phenyl group, a tolyl group, a naphthyl group or the like, a hydroxyl group, an alkoxyl group, an acyl group and the like.

Preferable substituents of Ar 2 include an amino group, a monoalkylamino group, a dialkylamino group, an acylamide group such as an acetylamide or the like, an aromatic amide group, a monoaromatic amino group, diaromatic amino group, a hydroxyl group, an alkoxyl group and an alkoxyalkoxyl group.

Further, the term "aliphatic group" or "aliphatic hydrocarbon group" used herein means a group generated by depriving a substituted or non-substituted aliphatic hydrocarbon of a hydrogen atom whereupon any one of saturated and unsaturated groups of straight-chain, branched-chain and cyclic types is permissible. So long as the group has an effect of the present invention, a number of carbon atoms thereof is not particularly limited, but is ordinarily from 1 to 36. Among these things, as a preferable group, mentioned is a straight-chain alkyl group, having carbon atoms of from 1 to 20, which may have a substituent. Above all, as an ordinary group, mentioned is a lower alkyl group having carbon atoms of from 1 to 4.

A number of the electron-donating group which is a substituent of Ar 2 is preferably from 1 to 4 and more preferably 1 or 2.

Further, an alkyl group, an aromatic group, an alkoxyl group or the like which is a substituent in an amino group which may be substituted, an alkoxyl group which may be substituted or the like may further be substituted. Examples of such substituents include a halogen atom such as iodine, bromine, chlorine or the like, a carbonyl group such as a carboxyl group, an ester group, a carbamoyl group, an aldehyde group, an acyl group, an acylamino group, an amide group, an alkylamide group, an aromatic amide group or the like, a phenyl group, a phenoxy group, an alkoxyl group, an alkoxyalkoxyl group, a vinyl group, a hydroxyl group, a sulfonic acid group, a sulfonic acid ester group, a sulfonamide group, a tosyl group, a cyano group, an isocyano group, a thiocyanato group, isothiocyanato group, a nitro group and the like.

The aromatic groups of Ar 1 and Ar 2 may each have other substituents than those described above. Specific examples of other substituents than those described above are not particularly limited, but ordinarily include an alkyl group, a cycloalkyl group, an aryl group, a cyano group, an isocyano group, a thiocyanato group, an isothiocyanato group, a nitro group, a nitrosyl group, an acyl group, a sulfonic acid group, a halogen atom and the like. Further, a carboxyl group, a hydroxyl group, a phosphoric acid group, a phosphoric ester group and a mercapto group which are examples of substituents essential to Ar 1 or an amino group, a monoalkylamino group, a dialkylamino group, an alkylamide group, an aromatic amide group, a monoaromatic amino group, a diaromatic amino group, a hydroxyl group, an alkoxyl group, an alkoxyalkyl group, an alkoxyalkyl group and the like which are examples of substituents essential to Ar 2 may be present in the other aromatic group as other substituents. A number of such other substituents is not particularly limited, but is preferably from about 0 to about 4 in each aromatic group.

Further, in the present invention, an alkyl chain in an alkyl group, an alkoxy group, an acyl group or the like may be any of a straight-chain type, a branched-chain type and a cyclic type which may have a substituent. A number of carbon atoms thereof is, for example, from 1 to about 36. As a preferable alkyl chain, mentioned is a saturated straight-chain alkyl, having carbon atoms of preferably from 1 to 20 and more preferably from 1 to 4, which may have a substituent.

A compound represented by the general formula (1) can be obtained by an usual method of synthesizing an azo compound. Namely, any one of aromatic amines represented by a formula (2) is diazotized and then coupled with an aromatic coupler represented by a formula (3) to obtain the compound of the formula (1). For example, m-aminosalicylic acid is diazotized with sodium nitrite in an aqueous solution of hydrochloric acid and then coupled with N,N-diethylaniline in an aqueous solution of acetic acid to obtain an azo compound represented by the following formula (4):

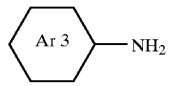

(2)

(3)

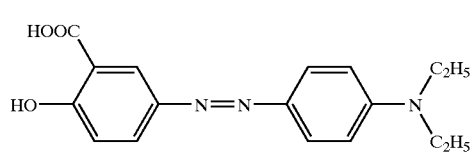

(4)

Examples of such compounds are described below. Examples of substituents of compounds in which Ar 1 and Ar 2 are both benzene rings, as being represented by a structural formula (5) below, are shown in Table 1. The terms "tolyl" and "ph" used in Table 1 mean a tolyl group and a phenyl group, respectively.

TABLE 1

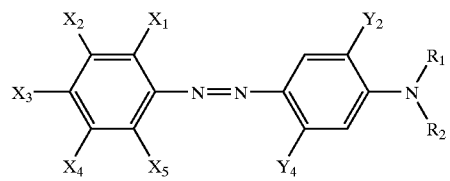

(5)

| Compound | X1 | X2 | X3 | X4 | X5 | Y2 | Y4 | R1 | R2 |
|---|---|---|---|---|---|---|---|---|---|
| 4 | H | COOH | OH | H | H | H | H | C2H5 | C2H5 |
| 10 | H | H | COOH | H | H | H | H | C2H5 | C2H5 |
| 11 | H | COOH | OH | H | H | OCH3 | CH3 | H | H |
| 12 | H | OH | COOH | H | H | H | H | C2H5 | C2H5 |
| 13 | H | COOH | OH | H | H | OCH3 | OCH3 | H | H |
| 14 | H | COOH | OH | H | H | OCH3 | NHCOCH3 | C2H5 | C2H5 |
| 15 | H | PO3H2 | H | H | H | OC2H5 | OCH3 | H | H |
| 16 | H | COOH | OH | H | H | H | H | H | H |
| 17 | H | COOH | OH | H | H | H | OH | C5H11 | C5H11 |
| 18 | H | COOH | OH | H | H | H | OH | tolyl | C2H5 |
| 19 | H | H | COOH | H | H | OCH3 | NHCOCH3 | C2H5 | C2H5 |
| 20 | H | H | COOH | H | H | H | OH | tolyl | C2H5 |
| 21 | H | H | COOH | H | H | H | OH | C5H11 | C5H11 |
| 22 | H | CH2COOH | H | H | H | H | H | CH3 | CH3 |
| 23 | NO2 | CH2OH | CH2OH | H | H | H | H | C8H17 | C8H17 |
| 24 | H | COOH | H | COOH | H | H | CH3 | CH2OC2H5 | H |
| 25 | H | OH | COOH | H | H | H | H | Ph | Ph |
| 26 | H | SH | H | H | H | H | H | C2H4CN | C2H4CN |
| 27 | H | PO(OH)OCH3 | H | H | H | OH | H | C2H4OCOPh | C2H5 |
| 28 | H | OH | COOH | H | H | Cl | OCH3 | C2H4OH | C2H4OH |
| 29 | CN | H | COOH | H | CN | H | H | CH2COOCH3 | CH3 |
| 30 | Br | H | COOH | H | Br | H | H | CH2COOCH3 | CH3 |
| 31 | H | OH | OH | H | H | OCH2CH3 | NHCOCH3 | H | H |
| 32 | H | COOH | COOH | OH | H | H | H | C2H5 | C2H5 |
| 33 | H | H | OH | H | H | H | NHCOCH3 | C2H4COOCH3 | C2H4COOCH3 |

Examples of substituents of compounds in which Ar 1 is a benzene ring and Ar2 is a naphthalene ring, as being represented by structural formulas (6) and (7) below, are shown in Table 2 and Table 3. Further, among these compounds, a compound 45 is a compound in which Y15 and Y16 are bonded with each other to form a naphthalimide in a ring state.

TABLE 2

(6)

[Structure of compound (6) with substituents X6-X9 on benzene ring, azo linkage N=N, and Y5-Y11 on naphthalene ring]

| compound | X6 | X7 | X8 | X9 | Y5 | Y6 | Y7 | Y8 | Y9 | Y10 | Y11 |
|---|---|---|---|---|---|---|---|---|---|---|---|
| 34 | OH | H | H | Cl | OH | H | H | H | H | H | H |
| 35 | OH | H | NO2 | H | OH | H | H | H | H | H | H |
| 36 | OH | H | H | NO2 | OH | H | H | H | H | H | H |
| 37 | H | COOH | OH | H | H | H | H | N(CH3)2 | H | H | H |
| 38 | H | H | COOH | H | OH | COOH | H | H | H | H | H |
| 39 | CH3 | H | N(CH3)2 | H | OH | COOH | H | H | H | H | H |
| 40 | SO3Na | H | NHCOCH3 | H | NH2 | H | H | H | H | COOH | OH |
| 41 | CF3 | H | Cl | H | NH2 | H | H | H | SO3Na | H | OH |
| 42 | H | OH | COOH | H | H | H | N(C2H5)2 | H | H | H | H |

TABLE 3

(7)

[Structure of compound (7) with substituents X11-X14 on benzene ring, azo linkage N=N, and Y11, Y13-Y17 on naphthalene ring]

| compound | X11 | X12 | X13 | X14 | Y11 | Y13 | Y14 | Y15 | Y16 | Y17 |
|---|---|---|---|---|---|---|---|---|---|---|
| 43 | OH | H | NO2 | H | OH | H | NH-Ph-NH2 | H | H | SO3Na |
| 44 | COOH | H | H | H | OH | H | NH2 | H | H | SO3Na |
| 45 | H | COOH | OH | H | OH | H | H | —CON(CH3)CO— | | H |
| 46 | H | PO3H2 | H | H | NH2 | NH2 | H | H | H | H |

Further, as compounds in which Ar 1 and Ar 2 are naphthalene rings, structural formulas (8) and (9) are exemplified below. Further, other than these compounds, mentioned are azo-type dyes having a condensed polycyclic aromatic group.

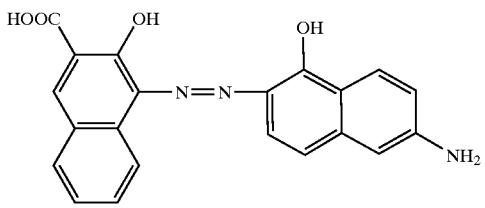

(8)

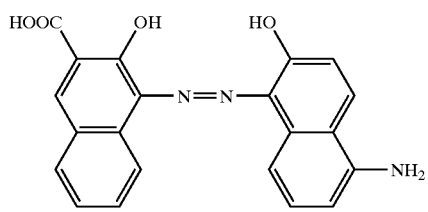

(9)

A dye-sensitized photoelectric conversion device according to the present invention is, for example, a device in which a thin film of an oxide semiconductor is produced on a substrate by using oxide semiconductor fine particles and then a dye is allowed to be adsorbed on the thus-produced thin film to sensitize it. As fine particles of the oxide semiconductor, a metal oxide is preferable; specific examples of such metal oxides include oxides of titanium, tin, zinc, tungsten, zirconium, gallium, indium, yttrium, niobium, tantalum, vanadium and the like. Among these oxides, oxides of titanium, tin, zinc, niobium, tungsten and the like are preferable and, above all, titanium oxide is most preferable. These oxide semiconductors can be used either alone or mixture thereof. An average particle diameter of the fine particles of the oxide semiconductor is ordinarily from 1 nm to 500 nm and preferably from 5 nm to 100 nm. These fine particles of the oxide semiconductor can also be used in a state of mixtures of large particle diameter ones and smaller particle diameter ones.

Formation of an oxide semiconductor thin film can be performed by a method in which oxide semiconductor fine particles are sprayed or the like to directly form a thin film on a substrate, a method in which an oxide semiconductor thin film is electrically precipitated by using a substrate as an electrode or a method in which a slurry of semiconductor fine particles to be described below is applied on a substrate, dried and cured or sintered. From the standpoint of performance of an oxide semiconductor electrode, a method which uses the slurry is preferable. In this method, the slurry can be obtained by dispersing the oxide semiconductor fine particles which, are in a secondary agglomeration state by a normal method such that an average primary particle diameter thereof comes to be from 1 nm to 200 nm in a dispersion medium.

Any dispersion medium of the slurry is usable, so long as it is capable of dispersing the semiconductor fine particles. Water or an organic solvent such as an alcohol such as ethanol or the like, a ketone such as acetone, acetylacetone or the like or a hydrocarbon such as hexane or the like is used and may be used in mixture thereof and, further, it is favorable to use water from a standpoint that it suppresses viscosity changes.

A temperature of sintering a substrate which has been coated with the slurry is approximately not higher than a melting point (softening point) of the substrate, ordinarily 900° C. as an upper limit and preferably 600° C. or less. Further, a period of time of sintering the substrate is not particularly limited, but is preferably within about 4 hours. Thickness of the thin film on the substrate is ordinarily from 1 $\mu$m to 200 $\mu$m and preferably from 5 $\mu$m to 50 $\mu$m.

The oxide semiconductor thin film may be subjected to a secondary treatment. Namely, for example, the thin film can directly be immersed together with the substrate in a solution of an alkoxide, a chloride, a nitride, a sulfide or the like of the same metal as the semiconductor and, then, dried or sintered again to enhance performance of the semiconductor thin film. Examples of such metal alkoxides include titanium ethoxide, titanium isopropoxide, titanium t-butoxide, n-dibutyl-diacetyl tin and the like and an alcoholic solution thereof is used. Examples of such chlorides include titanium tetrachloride, tin tetrachloride, zinc chloride and the like and an aqueous solution thereof is used.

Next, a method to adsorb a dye on the oxide semiconductor thin film is explained. As the above-described method, for adsorbing the dye thereon, mentioned is a method in which a substrate on which the above-described oxide semiconductor thin film has been provided is immersed in a solution obtained by dissolving a dye in a solvent capable of dissolving the dye or in a dispersion liquid obtained by dispersing a dye which has a low solubility. A concentration of the dye in the solution or the dispersion liquid is appropriately determined depending on dyes. The semiconductor thin film formed on the substrate is immersed in the solution. An immersion temperature is approximately from normal temperature up to a boiling point of the solvent and, further, an immersion period of time is from about 1 hour to about 48 hours. Specific examples of solvents to be used in dissolving the dye include methanol, ethanol, acetonitrile, dimethylsulfoxide, dimethylformamide and the like. A concentration of the dye in the solution is ordinarily favorably from $1\times10^{-6}$ M to 1 M and preferably from $1\times10^{-4}$ M to $1\times10^{-1}$ M. In such a way as described above, a photoelectric conversion device of the oxide semiconductor fine particles thin film which has been sensitized with the azo dye can be obtained. The dye to be adsorbed may be composed of one type or a mixture of several types. When the latter is the case, azo dyes according to the present invention may be mixed there among or mixed with other organic dye(s) and metal complex dye(s). Particularly by mixing dyes having different absorption wavelengths from one another, a wider absorption wavelength can be utilized and, as a result, a solar cell having high conversion efficiency can be obtained.

Examples of such metal complexes to be simultaneously used are not particularly limited, but metal complexes such as a ruthenium complex which have been disclosed in J. Am. Chem. Soc., 115, 6382 (1993) or JP-A-2000-26487 are preferable, phthalocyanine, porphyrin and the like.

Examples of other organic dyes to be simultaneously used include metal-free phthalocyanine, porphyrin, methine-type dyes such as cyanine, merocyanine, oxonol, a triphenyl methane type and the like, dyes such as a xanthene type, other azo types than those represented by the general formula (1) used in the present invention, an anthraquinone type and the like. The ruthenium complex or methine-type dyes such as cyanine, merocyanine and the like are preferable.

When the azo dye is adsorbed on the thin film of the oxide semiconductor fine particles, it is effective to adsorb the dye in the presence of an inclusion compound in order to prevent dyes from associating with each other. Examples of inclusion compounds include steroid-type compounds such as cholic acid and the like, crown ethers, cyclodextrin, calixarene, polyethylene oxide and the like. Cholic acid, polyethylene oxide and the like are preferable. Further, after the dye is adsorbed thereon, a surface of a semiconductor electrode may be treated with an amine compound such as 4-t-butylpyridine or the like. As a method for such treatment, for example, a method in which a substrate provided with a thin film, on which the dye is adsorbed, of the semiconductor fine particles are immersed in an ethanol solution of an amine or the like can be adopted.

The solar cell according to the present invention comprises a photoelectric conversion device electrode in which the dye is adsorbed on the above-described oxide semiconductor thin film, a counter electrode and a redox electrolyte or a hole transfer material. The redox electrolyte may be a solution in which a redox pair is dissolved in a solvent, a gel electrolyte that a polymer matrix is impregnated with a redox pair or a solid electrolyte such as a fused salt. Examples of hole transfer materials include an amine derivative, an electrically conductive polymer such as polyacetylene, polyaniline, polythiophene or the like, a material using a discotic liquid crystal phase such as polyphenylene and the like. The counter electrode to be used is preferably an electrode which has electric conductivity and catalytically acts on a reduction reaction of the redox electrolyte. For example, a material in which platinum, carbon, rhodium, ruthenium or the like is vapor-deposited on glass or a polymer film, or electrically conductive fine particles are applied thereon can be used.

Examples of redox electrolytes to be used in solar cells according to the present invention include, a halogen oxidation-reduction type electrolyte comprising a halogen compound in which a halogen ion is allowed to be a counter ion and a halogen molecule, a metal oxidation-reduction type electrolyte of a metal complex or the like such as ferrocyanate-ferricyanate, ferrocene-ferricinium ion or the like, alkylthiol-alkyldisulfide, a viologen dye, an aromatic oxidation-reduction type electrolyte such as hydroquinone-quinone or the like, and the like. Among these electrolytes, the halogenoxidation-reduction type electrolyte is preferable. The halogen molecule in the halogen oxidation-reduction type electrolyte comprising halogen compound-halogen molecule include for example, an iodine molecule, a bromine molecule or the like. The iodine molecule is preferable. Further, examples of the halogen compounds having a halogen ion as a counter ion include a halogenated metal salt such as an alkali metal iodide compound, for example, LiI, NaI, KI, CsI or the like and an alkali earth metal, iodide compound, for example, $CaI_2$ or the like, and an organic quaternary ammonium salt of halogen such as an alkyl ammonium iodide, for example, a tetraalkyl ammonium iodide or the like, and a quaternary ammonium salt of a nitrogen-containing 5 or 6-membered cyclic compound, for example, imidazolium iodide, pyridinium iodide or the like. Among these compounds, a salt-type compound having the iodine ion as a counter ion is preferable. Examples of preferable salt-type compounds having an iodine ion as a counter ion include an alkali metal iodide such as lithium iodide, sodium iodide or the like and a tri ($C_1$ to $C_4$) alkyl ammonium iodide such as trimethyl ammonium iodide or the like.

Further, when the redox electrolyte is constituted in a solution state containing itself, an electrically inert solvent is used as a solvent therefore. Examples of the solvents include acetonitrile, propylene carbonate, ethylene carbonate, 3-methoxypropionitrile, methoxyacetonitrile, ethylene glycol, propylene glycol, diethylene glycol, triethylene glycol, a-butyrolactone, dimethoxyethane, diethyl carbonate, diethyl ether, diethyl carbonate, dimethyl carbonate, 1,2-dimethoxy ethane, dimethyl formamide, dimethyl sulfoxide, 1,3-dioxolane, methyl formate, 2-methyl tetrahydrofuran, 3-methoxy-oxaziridine-2-on, sulfolane, tetrahydrofuran, water and the like. Among these solvents, particularly, acetonitrile, propylene carbonate, ethylene carbonate, 3-methoxypropionitrile, methoxyacetonitrile, ethylene glycol, 3-methoxyoxaziridine-2-on and the like are preferable. These solvents may be used either alone or in any combination of two or more. In a case of the gel electrolyte, a polyacrylate or polymethacrylate resin or the like are used as a matrix for the gel electrolyte. A concentration of the redox electrolyte is ordinarily from 0.01% by weight to 99% by weight and preferably from about 0.1% by weight to about 90% by weight.

The counter electrode is disposed against an electrode of the photoelectric conversion device adsorbing the dye in the oxide semiconductor thin film disposed on the substrate such that the electrode of the photoelectric conversion device is interposed. The solar cell according to the present invention can be obtained by filling a solution containing the redox electrolyte between the electrode of the photoelectric conversion device and the counter electrode.

EXAMPLES

The present invention is now more specifically described with reference to the examples. However, it should be noted that these examples should not be interpreted as limiting the present invention in any way. Unless stated otherwise, all parts and percentages in these examples are given by mass.

Synthesis Example 1

One part of p-amino benzoic acid was dispersed in 25 parts of 45% sulfuric acid and, then, the resultant dispersion was mixed with two parts of 43% nitrosyl sulfuric acid while being kept at 10° C. or less and, thereafter, agitated for 3 hours to diazotize. The resultant diazo solution was added to the solution at 5° C. or below in which 1.4 part of 3-acetylamino-6-methoxy-N,N-diethylaniline was dissolved in 8 parts of diluted sulfuric acid to perform coupling. The resultant solid was filtered, washed, dried and, then, separated by to a column chromatography with a mixed solvent of ethyl acetate and hexane to obtain a small quantity of a compound (19).

Synthesis Example 2

3 parts of 5-aminosalicylic acid was dispersed in 25 parts of water and, then, 1.5 part of sodium nitrite was added thereto. The resultant mixture was, added dropwise to a solution of 10 parts of water and 3 parts of concentrated hydrochloric acid at 10° C. or below and, thereafter, agitated for 3hours to diazotize. After diazotization was completed, 3 parts of N,N-diethyl aniline dissolved in 4 parts of acetic acid was added dropwise to the thus-diazotized mixture at a temperature of 10° C. or below to perform coupling while adjusting a pH of the mixture with soda ash to keep it from 2 to 5. A solid obtained after agitation for 3 hours was filtered, washed, dried and, further, separated by to a column chromatography with a mixed solvent of ethyl acetate and hexane to obtain a small quantity of a compound (4).

Example 1

An azo dye of the compound (4) was dissolved in EtOH such in a concentration of from $3 \times 10^{-4}$ M to $5 \times 10^{-4}$ M. In the resultant solution, a porous substrate (which had been prepared by firstly dispersing titanium dioxide P-25 (trade name; manufactured by Nippon Aerosil Co., Ltd.) in an aqueous. solution of nitric acid and, secondly, applying the thus-dispersed titanium dioxide on a glass electrode in a thickness of 50 μm and, then, sintering it at 450° C. for 30 minutes) is immersed at room temperature for from 3 hours to one night to adsorb the above-described azo dye thereon, washed with EtOH and dried to obtain a photoelectric conversion device of a dye-sensitized semiconductor thin film.

As a counter electrode, an electrically conductive glass whose surface had been sputtered by platinum was fixed such that the dye-sensitized semiconductor thin film is interposed and, then, a gap made therebetween was filled with an electrolyte-containing solution (electrolytic solution) B (which had been prepared by dissolving iodine/tetra-n-propyl ammonium iodide in a solution composed of ethylene carbonate and acetonitrile at a ratio of 6 to 4 such that they came to be in concentrations of 0.02 M/0.5 M, respectively) to prepare a solar cell. The thus-prepared solar cell having an execution part of 0.25 $cm^2$ was used for measurement of cell performance.

Measurement of cell performance: A light source using a 500 W xenon lamp was set to be 100 mW/$cm^2$ through an AM 1.5 filter. Short circuit current, open circuit voltage, conversion efficiency and a fill factor were measured by using a potentiogalvanostat. The results are shown in Table 4.

Example 2

A photoelectric conversion device of a semiconductor thin film was obtained in a same manner as in Example 1 except for using a titanium tetrachloride-treated semiconductor thin film electrode which had been prepared by dropping 0.2 M aqueous solution of titanium tetrachloride on a titanium oxide thin film part of the porous substrate (semiconductor thin film electrode in which porous titanium oxide was sintered on a transparent electrically conductive glass electrode) in Example 1, leaving the resultant substrate to stand at room temperature for 24 hours, washing it with water and sintering it again at 450° C. for 30 minutes. A solar cell was prepared and cell performance was measured in a same manner as in Example 1.

Examples 3 to 18

In Examples 3 to 5, 7, 9, 10, 1.2, 14, 15 and 17, a photoelectric conversion device and a solar cell were prepared and cell performance was measured in a same manner as in Example 1 except that a dye shown in Table 4 and an electrolytic solution to be described below were used and, further, in Example 12, DMSO was used as a solvent for adsorbing the dye.

Further, respective compositions of electrolytic solutions are as follows:

Electrolytic solution A: Iodine/lithium iodide/1,2-dimethyl-3-n-propyl imidazolium iodide/t-butyl pyridine were dissolved in 3-methoxypropionitrile in concentrations of 0.1 M/0.1 M/0.6 M/1 M, respectively.

Electrolytic solution B: Iodine/tetra-n-propyl ammonium iodide were dissolved in a solution composed of ethylene carbonate and acetonitrile at a ratio of 6 to 4 in concentrations of 0.02 M/0.5 M, respectively.

Electrolytic solution C: Iodine/lithium iodide were dissolved in propylene carbonate in concentrations of 0.05 M/0.55 M, respectively.

Example 6 was conducted in a same manner as in Example 2 except that a dye shown in Table 4 was used and EtOH was used as a solvent for the dye.

In Examples 8 and 11, each dye shown in Table 4 was used, EtOH was used as a solvent for the dye and cholic acid was added as an inclusion compound at the time of adsorbing the dye in a concentration of $3 \times 10^{-2}$ M to prepare a dye solution and, then, the thus-prepared dye solution was applied on a semiconductor thin film to obtain a cholic acid-treated dye-sensitized semiconductor thin film. Other procedures than those described above were conducted in a same manner as in Example 1.

In Example 13, a dye shown in Table 4 was used, DMSO was used as a solvent for the dye, a titanium tetrachloride-treated semiconductor thin film electrode obtained in a same manner as in Example 2 was used and further procedures were conducted in a same manner as in Examples 8 and 11 to prepare a cholic acid-treated dye-sensitized semiconductor thin film. Other procedures than those described above were conducted in a same manner as in Example 1.

In Examples 16 and 18, respective two dyes shown in Table 4 were used to prepare an EtOH solution in each concentration of $1.5 \times 10^{-4}$ M and, then, the two dyes were adsorbed to obtain a photoelectric conversion device in a same manner as in Example 1. Other procedures than those described above were conducted in a same manner as in Example 1.

Further, a structure of a dye of No. 47 used in Example 18 is as follows:

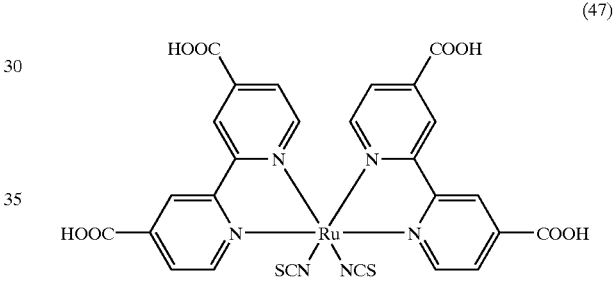

(47)

Further, the results of measurements of a cell performance are shown in Table 4.

TABLE 4

| Example | Azo dye | Short circuit current (mA/cm2) | Open circuit voltage (V) | Conversion efficiency (%) | Form factor | TiCl4 of thin film | Cholic acid | Electrolytic solution |
|---|---|---|---|---|---|---|---|---|
| 1 | 4 | 3.89 | 0.58 | 1.07 | 0.48 | Untreated | Untreated | B |
| 2 | 4 | 5.02 | 0.64 | 1.62 | 0.51 | Treated | Untreated | B |
| 3 | 10 | 0.31 | 0.59 | 0.08 | 0.42 | Untreated | Untreated | B |
| 4 | 10 | 1.01 | 0.39 | 0.26 | 0.65 | Untreated | Untreated | C |
| 5 | 11 | 1.32 | 0.47 | 0.41 | 0.67 | Untreated | Untreated | B |
| 6 | 11 | 1.98 | 0.48 | 0.66 | 0.70 | Treated | Untreated | B |
| 7 | 14 | 3.92 | 0.60 | 1.18 | 0.51 | Untreated | Untreated | B |
| 8 | 14 | 4.90 | 0.58 | 1.60 | 0.56 | Untreated | Treated | B |
| 9 | 15 | 0.24 | 0.44 | 0.05 | 0.46 | Untreated | Untreated | B |
| 10 | 17 | 3.66 | 0.58 | 0.96 | 0.46 | Untreated | Untreated | B |
| 11 | 17 | 4.68 | 0.58 | 1.50 | 0.56 | Untreated | Treated | B |
| 12 | 34 | 0.13 | 0.44 | 0.03 | 0.45 | Untreated | Untreated | A |
| 13 | 36 | 1.07 | 0.46 | 0.24 | 0.49 | Treated | Treated | B |
| 14 | 44 | 0.14 | 0.41 | 0.02 | 0.44 | Untreated | Untreated | A |
| 15 | 18 | 2.90 | 0.50 | 0.80 | 0.55 | Untreated | Untreated | A |
| 16 | 11 + 18 | 3.00 | 0.50 | 0.90 | 0.60 | Untreated | Untreated | A |
| 17 | 33 | 1.10 | 0.50 | 0.30 | 0.56 | Untreated | Untreated | A |
| 18 | 33 + 47 | 11.7 | 0.64 | 4.50 | 0.60 | Untreated | Untreated | A |

Industrial Applicability

In a dye-sensitized photoelectric conversion device according to the present invention, a practical solar cell having high conversion efficiency can be provided by using a specified low-cost azo dye.

What is claimed is:

1. A photoelectric conversion device, comprising oxide semiconductor fine particles sensitized with at least one monoazo dye represented by the following formula (1):

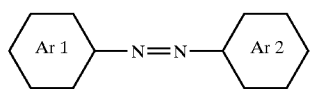

(1)

wherein Ar 1 represents an aromatic group having at least one substituent selected from the group consisting of a carboxyl group, a hydroxyl group, a phosphoric acid group, a phosphoric ester group and a mercapto group wherein said substituent is bonded to the aromatic group either directly or via a cross-linking group; and Ar 2 represents an aromatic group having at least one electron-donating group as a substituent.

2. The photoelectric conversion device as set forth in claim 1, wherein Ar 1 has at least 2 substituents selected from the group consisting of a carboxyl group, a hydroxyl group, a phosphoric acid group, a phosphoric ester group and a mercapto group.

3. The photoelectric conversion device as set forth in claim 2, characterized in that at least 2 of substituents on Ar 1 are groups selected from the group consisting of a carboxyl group and a hydroxyl group.

4. The photoelectric conversion device as set forth in claim 2, wherein at least 2 of substituents on Ar 1 are substituted at any two adjacent positions within a same aromatic ring.

5. The photoelectric conversion device as set forth in any one of claims 1 to 4, wherein the electron-donating groups in Ar 2 are one, or two or more substituents, which may further be substituted, selected from the group consisting of an amino group, a hydroxyl group and an alkoxyl group.

6. The photoelectric conversion device as set forth in any one of claims 1 to 4, comprising oxide semiconductor fine particles sensitized with the monoazo dye and another metal complex and/or an another organic dye are used.

7. The photoelectric conversion device as set forth in any one of claims 1 to 4 wherein the oxide semiconductor fine particles contain titanium dioxide as an essential component.

8. The photoelectric conversion device as set forth in any one of claims 1 to 4, wherein a dye is adsorbed on the oxide semiconductor fine particles in the presence of an inclusion compound.

9. A solar cell, comprising the photoelectric conversion device as set forth in any one of claims 1 to 4.

10. The photoelectric conversion device as set forth in claim 5, comprising oxide semiconductor fine particles sensitized with the monoazo dye and another metal complex and/or an another organic dye.

11. The photoelectric conversion device as set forth in claim 5 wherein the oxide semiconductor fine particles contain titanium dioxide as an essential component.

12. The photoelectric conversion device as set forth in claim 6 wherein the oxide semiconductor fine particles contain titanium dioxide as an essential component.

13. The photoelectric conversion device as set forth in claim 5, wherein the monoazo dye is adsorbed on the oxide semiconductor fine particles in the presence of an inclusion compound.

14. The photoelectric conversion device as set forth in claim 6, wherein the monoazo dye is adsorbed on the oxide semiconductor fine particles in the presence of an inclusion compound.

15. The photoelectric conversion device as set forth in claim 7, wherein the monoazo dye is adsorbed on the oxide semiconductor fine particles in the presence of an inclusion compound.

16. A solar cell, comprising the photoelectric conversion device as set forth in claim 5.

17. A solar cell, comprising the photoelectric conversion device as set forth in claim 6.

18. A solar cell, comprising the photoelectric conversion device as set forth in claim 7.

19. A solar cell, comprising the photoelectric conversion device as set forth in claim 8.

20. A photoelectric conversion device, comprising a semiconductor thin film which adsorbs thereon at least one monoazo dye represented by the following formula (1):

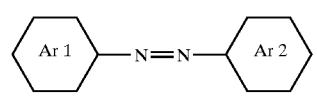

(1)

wherein Ar 1 represents an aromatic group having at least one substituent selected from the group consisting of a carboxylic acid group, a hydroxyl group, a phosphoric acid group, a phosphoric acid ester group and a mercapto group wherein said substituent is bonded to the aromatic group either directly or via a cross-linking group; and Ar 2 represents an aromatic group having at least one electron-donating group as a substituent, said semiconductor thin film being formed from oxide semiconductor fine particles.

* * * * *